(12) United States Patent
Lee et al.

(10) Patent No.: US 9,634,099 B2
(45) Date of Patent: Apr. 25, 2017

(54) LATERAL DOUBLE DIFFUSED METAL-OXIDE-SEMICONDUCTOR DEVICE AND METHOD FOR FABRICATING THE SAME

(71) Applicant: VANGUARD INTERNATIONAL SEMICONDUCTOR CORPORATION, Hsinchu (TW)

(72) Inventors: Tsung-Hsiung Lee, Taoyuan (TW); Jui-Chun Chang, Hsinchu (TW); Shang-Hui Tu, Jhubei (TW)

(73) Assignee: VANGUARD INTERNATIONAL SEMICONDUCTOR CORPORATION, Hsinchu (TW)

( * ) Notice: Subject to any disclaimer, the term of this patent is extended or adjusted under 35 U.S.C. 154(b) by 426 days.

(21) Appl. No.: 14/054,549

(22) Filed: Oct. 15, 2013

(65) Prior Publication Data

US 2015/0102407 A1    Apr. 16, 2015

(51) Int. Cl.
| | |
|---|---|
| *H01L 29/40* | (2006.01) |
| *H01L 29/78* | (2006.01) |
| *H01L 29/417* | (2006.01) |
| *H01L 29/66* | (2006.01) |
| *H01L 29/10* | (2006.01) |

(52) U.S. Cl.
CPC ........ *H01L 29/402* (2013.01); *H01L 29/1087* (2013.01); *H01L 29/1095* (2013.01); *H01L 29/41766* (2013.01); *H01L 29/66659* (2013.01); *H01L 29/7835* (2013.01); *H01L 29/1083* (2013.01)

(58) Field of Classification Search
CPC ........... H01L 29/7816; H01L 29/66681; H01L 29/0878; H01L 29/402; H01L 29/1087; H01L 29/1095
USPC ....................................................... 257/343
See application file for complete search history.

(56) References Cited

U.S. PATENT DOCUMENTS

| | | | |
|---|---|---|---|
| 5,869,875 A | 2/1999 | Hebert | |
| 8,138,049 B2 | 3/2012 | You | |
| 8,987,820 B1 * | 3/2015 | Lee | .................. H01L 29/7816 257/335 |

(Continued)

FOREIGN PATENT DOCUMENTS

CN    102738215 A    10/2012

*Primary Examiner* — Nathan W Ha
(74) *Attorney, Agent, or Firm* — Birch, Stewart, Kolasch & Birch, LLP

(57) ABSTRACT

A lateral double diffused metal-oxide-semiconductor device includes: an epitaxial semiconductor layer disposed over a semiconductor substrate; a gate dielectric layer disposed over the epitaxial semiconductor layer; a gate stack disposed over the gate dielectric layer; a first doped region disposed in the epitaxial semiconductor layer from a first side of the gate stack; a second doped region disposed in the epitaxial semiconductor layer from a second side of the gate stack; a third doped region disposed in the first doping region; a fourth doped region disposed in the second doped region; an insulating layer covering the third doped region, the gate dielectric layer, and the gate stack; a conductive contact disposed in the insulating layer, the third doped region, the first doped region and the epitaxial semiconductor layer; and a fifth doped region disposed in the epitaxial semiconductor layer under the conductive contact.

13 Claims, 5 Drawing Sheets

(56) References Cited

U.S. PATENT DOCUMENTS

| | | |
|---|---|---|
| 2007/0034942 A1 | 2/2007 | Xu et al. |
| 2007/0034944 A1* | 2/2007 | Xu .................... H01L 29/402 |
| | | 257/335 |
| 2012/0273879 A1* | 11/2012 | Mallikarjunaswamy ................ |
| | | H01L 29/4175 |
| | | 257/335 |

* cited by examiner

LATERAL DOUBLE DIFFUSED METAL-OXIDE-SEMICONDUCTOR DEVICE AND METHOD FOR FABRICATING THE SAME

BACKGROUND OF THE INVENTION

Field of the Invention

The present invention relates to integrated circuit (IC) devices, and in particular to a lateral double diffused metal-oxide-semiconductor (LDMOS) device and a method for fabricating the same.

Description of the Related Art

Recently, due to the rapid development of communication devices such as mobile communication devices and personal communication devices, wireless communication products such as mobile phones and base stations have been greatly developed. In wireless communication products, high-voltage elements of lateral double diffused metal-oxide-semiconductor (LDMOS) devices are often used as radio frequency (900 MHz-2.4 GHz) related elements therein.

LDMOS devices not only have a higher operating frequency, but they are also capable of sustaining a higher breakdown voltage, thereby having a high output power so that they can be used as power amplifiers in wireless communication products. In addition, due to the fact that LDMOS devices can be formed by conventional CMOS fabrications, LDMOS devices can be fabricated from a silicon substrate which is relatively cost-effective and employs mature fabrication techniques.

In FIG. 1, a schematic cross section showing a conventional N-type lateral double diffused metal-oxide-semiconductor (LDMOS) device applicable in a radio frequency (RF) circuit element is illustrated. As shown in FIG. 1, the N-type LDMOS device mainly comprises a P+ type semiconductor substrate 100, a P− type epitaxial semiconductor layer 102 formed over the P+ type semiconductor substrate 100, and a gate structure G formed over a portion of the P− type epitaxial semiconductor layer 102. A P− type doped region 104 is disposed in the P− type epitaxial semiconductor layer 102 under the gate structure G and a portion of the P− type epitaxial semiconductor layer 102 under the left side of the gate structure G, and an N− type drift region 106 is disposed in a portion of the P− type epitaxial semiconductor layer 102 under the right side of the gate structure G. A P+ type doped region 130 and an N+ type doped region 110 are disposed in a portion of the P type doped region 104, and the P+ doped region 130 partially contacts a portion of the N+ type doped region 110, thereby functioning as a contact region (e.g. P+ type doped region 130) and a source region (e.g. N+ type doped region 110) of the N type LDMOS device, respectively, and another N+ type doped region 108 is disposed in a portion of the P− type epitaxial semiconductor layer 102 at the right side of the N− type drift region 106 to function as a drain region of the N type LDMOS device. In addition, an insulating layer 112 is formed over the gate structure G, covering sidewalls and a top surface of the gate structure G and partially covering the N+ type doped regions 108 and 110 adjacent to the gate structure G. Moreover, the N type LDMOS further comprises a P+ type doped region substantially disposed in a portion of the P− type epitaxial semiconductor layer 102 under the N+ type doped region 110 and the P− type doped region 104 under the N+ type doped region 110. The P+ type doped region 120 physically connects the P− type doped region 104 with the P+ type semiconductor substrate 100.

During operation of the N type LDMOS device shown in FIG. 1, due to the formation of the P+ type doped region 120, currents (not shown) from the drain side (e.g. N+ type doped region 108) laterally flow through a channel (not shown) underlying the gate structure G towards a source side (e.g. N+ type doped region 110), and are then guided by the P− type doped region 104 and the P+ type doped region 120, thereby arriving at the P+ type semiconductor substrate 100, such that problems such as inductor coupling and cross-talk between adjacent circuit elements can be avoided. However, the formation of the P+ type doped region 120 requires the performance of ion implantations of high doping concentrations and high doping energies and thermal diffusion processes with a relatively high temperature above about 900° C., and a predetermined distance D1 is kept between the gate structure G and the N+ type doped region 110 at the left side of the gate structure G to ensure good performance of the N type LDMOS device. Therefore, formation of the P+ type doped region 120 and the predetermined distance D1 kept between the gate structure G and the N+ type doped region 110 increase the on-state resistance (Ron) of the N type LDMOS device and a dimension of the N type LDMOS device, which is unfavorable for further reduction of both the fabrication cost and the dimensions of the N type LDMOS device.

BRIEF SUMMARY OF THE INVENTION

Accordingly, an improved lateral double diffused metal oxide semiconductor (LDMOS) device and method for fabricating the same are provided to reduce size and fabrication cost.

An exemplary lateral double diffused metal oxide semiconductor (LDMOS) device comprises: a semiconductor substrate, having a first conductivity type; an epitaxial semiconductor layer formed over the semiconductor substrate, having the first conductivity type; a gate dielectric layer formed over the epitaxial semiconductor layer, having a step-like cross-sectional structure; a gate stack conformably disposed over the gate dielectric layer; a first doped region disposed in a portion of the epitaxial semiconductor layer adjacent to a first side of the gate stack, having the first conductivity type; a second doped region disposed in a portion of the epitaxial semiconductor layer adjacent to a second side of the gate stack opposite to the first side, having a second conductivity type opposite to the first conductivity type; a third doped region disposed in a portion of the first doped region, having the second conductivity type; a fourth doped region disposed in a portion of the second doped region, having the second conductivity type; an insulating layer covering the third doped region, the gate dielectric layer, and the gate stack; a conductive contact formed in a portion of the insulating layer, the third doped region, the first doped region, and the epitaxial semiconductor layer; and a fifth doped region disposed in a portion of the epitaxial semiconductor layer under the conductive contact, having the first conductivity type, wherein the fifth doped region physically contacts the semiconductor substrate and the conductive contact.

An exemplary method for fabricating a lateral double diffused metal oxide semiconductor (LDMOS) device comprises: performing a semiconductor substrate, having a first conductivity type; forming an epitaxial semiconductor layer over the semiconductor substrate, having the first conductivity type; forming a first doped region in a portion of the epitaxial semiconductor layer, having a second conductivity type opposite to the first conductivity type; forming a first dielectric layer over the first doped region in the epitaxial semiconductor layer; forming a second dielectric layer over a portion of the epitaxial semiconductor layer, being adjacent to the first dielectric layer and contacting thereof, wherein the first dielectric layer and the second dielectric layer have different thicknesses; forming a gate stack over a portion of the first dielectric layer and a portion of the second dielectric layer; forming a second doped region in a portion of the epitaxial semiconductor layer adjacent to a first side of the gate stack, having the first conductivity type; forming a third doped region in a portion of the second doped region at the first side of the gate stack, having the second conductivity type opposite to the first conductivity type; forming an insulating layer over the first dielectric layer, the gate stack, and the second dielectric layer; forming a first trench at the first side of the gate stack, wherein the first trench penetrates a portion of the insulating layer, the second dielectric layer, the third doped region, the first doped region, and the epitaxial semiconductor layer; performing a first ion implantation process, forming a fourth doped region in a portion of the epitaxial semiconductor layer exposed by the first trench, wherein the fourth doping region contacts the semiconductor substrate and has the first conductivity type; forming a first conductive contact in the first trench, contacting the fourth doped region; forming an interlayer dielectric layer over the insulating layer and the first conductive contact; forming a second trench at the second side of the gate stack opposite to the first side, wherein the second trench penetrates a portion of the interlayer dielectric layer, the insulating layer, and the second dielectric layer and exposes a portion of the first doped region; performing a second ion implantation process, forming a fifth doped region in a portion of the first doped region exposed by the second trench, wherein the fifth doped region has the second conductivity type; and forming a second conductive contact in the second trench, contacting the fifth doped region.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 2-8 are schematic cross sections showing a method for fabricating a lateral double diffused metal-oxide-semiconductor (LDMOS) device applicable for a radio frequency (RF) circuit element according to an embodiment of the invention.

Figure 2:
FIGS. 2-8 are schematic cross sections showing a method for fabricating a lateral double diffused metal-oxide-semiconductor (LDMOS) device according to an embodiment of the invention.

Referring to FIG. 2, a semiconductor substrate 200 such as a silicon substrate is first provided. In one embodiment, the semiconductor substrate 200 has a first conductivity type such as a P type, and a resistivity of about 0.001-0.005 ohms-cm ($\Omega$-cm). Next, an epitaxial semiconductor layer 202 is formed over the semiconductor substrate 200. The epitaxial semiconductor layer 202 may comprise epitaxial materials such as silicon, and can be in-situ doped with dopants of the first conductivity type such as P type during the formation thereof, and has a resistivity of about 0.5-1 ohms-cm ($\Omega$-cm). In one embodiment, the resistivity of the epitaxial semiconductor layer 202 is greater than that of the semiconductor substrate 200.

Figure 3:
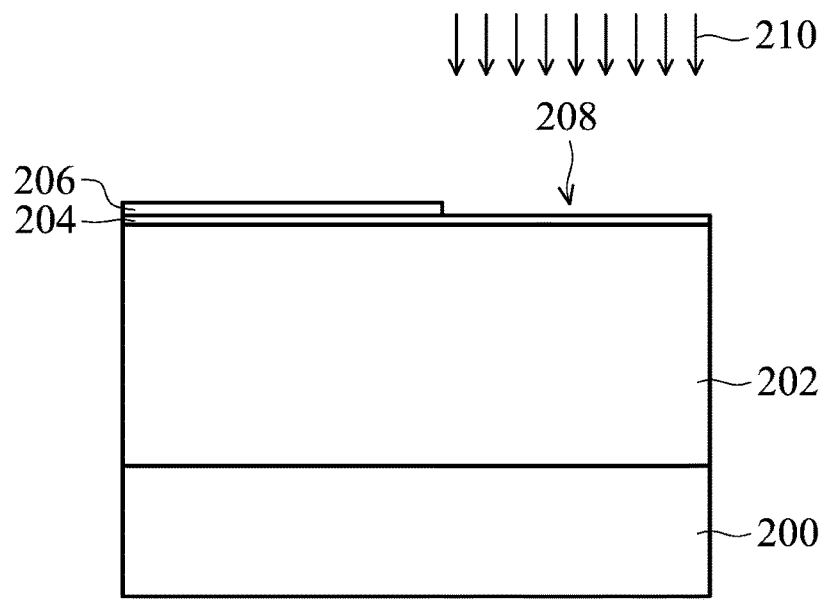

Referring to FIG. 3, a pad oxide layer 204 and a pad nitride layer 206 are sequentially formed over the epitaxial semiconductor layer 202. The pad oxide layer 204 may comprise materials such as silicon dioxide, and the pad nitride layer 206 may comprise materials such as silicon nitride. Next, a patterning process (not shown) comprising photolithography and etching steps is performed, and an opening 208 is formed in a portion of the pad nitride layer 208. The opening 208 exposes a portion of the underlying pad oxide layer 204. Next, an ion implantation process 210 is performed on the region exposed by the opening 208, using the pad nitride layer 206 as an ion implantation mask. The ion implantation process 210 implants dopants of a second conductivity type such as N-type through the portion of the pad oxide layer 206 exposed by the opening 208, thereby entering into a portion of the epitaxial semiconductor layer 202.

Figure 4:
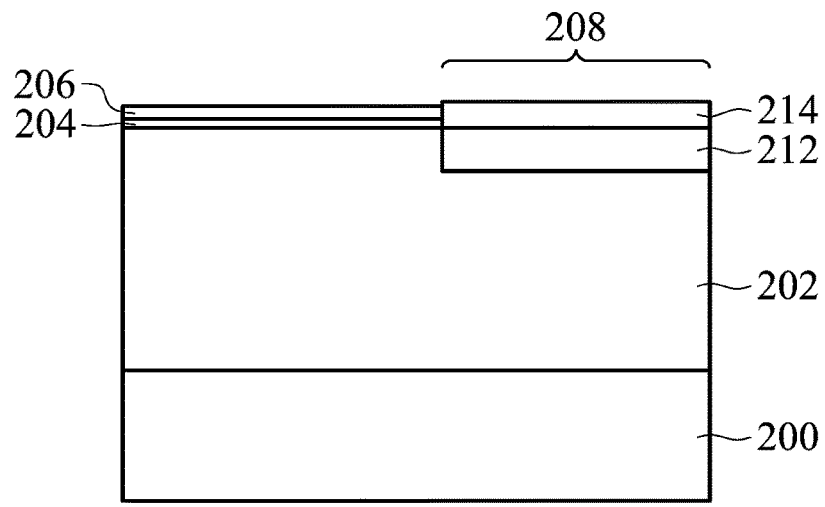

Referring to FIG. 4, after performing the ion implantation process 210 (see FIG. 3), a doped region 212 is formed in a portion of the epitaxial semiconductor layer 202, having the second conductivity type opposite to the first conductivity type of the epitaxial semiconductor layer 202 and a dopant concentration of about $5*10^{11}$-$5*10^{13}$ atom/cm$^2$. Herein, the doped region 212 functions as a drift-region. Next, an etching process (not shown) such as dry etching is performed, using the pad nitride layer 206 as an etching mask, to remove the portion of the pad oxide layer 204 exposed by the opening 208, thereby exposing a top surface of the doped region 212 in the epitaxial semiconductor layer 202. Next, a deposition process (not shown) is performed, forming a dielectric layer 214 over the epitaxial semiconductor layer 202 exposed by the opening 208. Herein, a top surface of the dielectric layer 214 is slightly above the top surface of the pad nitride layer 206. However, the top surface of the dielectric layer 214 may be slightly below or planar with the top surface of the pad nitride layer 206 in other embodiments. In one embodiment, the dielectric layer 214 may comprise materials such as silicon oxide, and can be formed by, for example, thermal oxidation.

Figure 5:
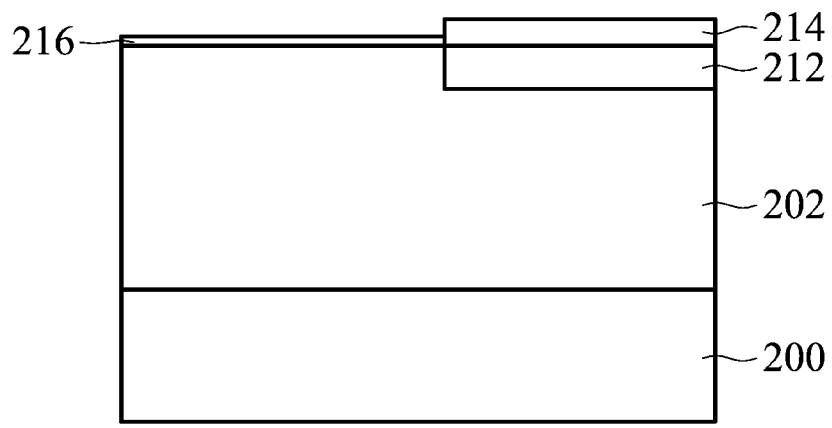

Referring to FIG. 5, an etching process (not shown) is performed, using the dielectric layer 214 as an etching mask, to sequentially remove the pad nitride layer 206 and the pad oxide layer 204 over the epitaxial semiconductor layer 202, thereby exposing a surface of the other portion of the epitaxial semiconductor layer 202. Herein, during removal of the pad oxide layer 204, a portion of the dielectric layer 214 may be partially removed. Next, a deposition process (not shown) is performed to form another dielectric layer 216 over the top surface of the epitaxial semiconductor layer 202 not covered by the dielectric layer 214. In the deposition process for forming the dielectric layer 216, dielectric materials are also formed over the surface of the dielectric layer 214, thereby increasing the thickness of the dielectric layer 214. In one embodiment, the dielectric layer 216 may comprise the same materials as that of the dielectric layer 214, such as silicon dioxide, and can be formed by a deposition process such as thermal oxidation.

Figure 6:
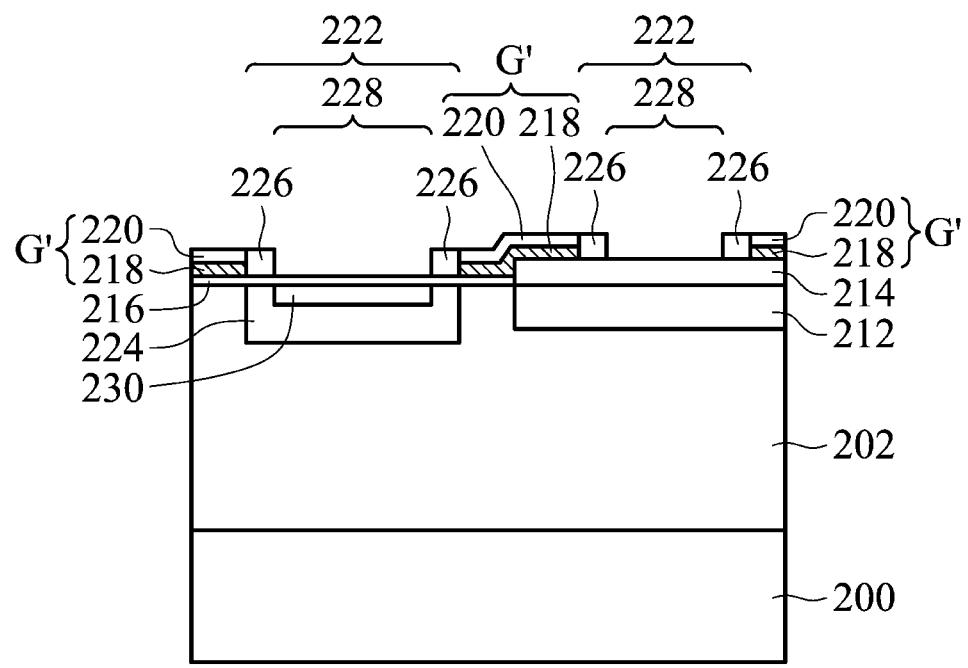

Referring to FIG. 6, a conductive layer 218 and a mask layer 220 are sequentially and conformably formed over surfaces of the dielectric layer 214 and the dielectric layer 216, and are then patterned by a patterning process (not shown) comprising photolithography and etching steps into a plurality of separated patterned conductive layers 218 and mask layers 220. These separated patterned conductive layer 218 and mask layer 220 are respectively illustrated as a gate stack G'. In one embodiment, the conductive layer 218 may comprise conductive materials such as doped polysilicon, and the mask layer 220 may comprise masking materials such as silicon dioxide and silicon nitride. In addition, a plurality of separated openings 222 are formed between these gate stacks G', respectively. As shown in FIG. 6, the openings 222 respectively expose a portion of the dielectric layer 216 and a portion of the dielectric layer 214, and one of the gate stacks G' partially extends over a portion of the adjacent dielectric layers 214 and 216. The conductive layer 218 in the gate stack G' that extends over a portion of the adjacent dielectric layers 214 and 216 may function as a gate electrode layer, and the portion of the dielectric layers 214 and 216 covered by this conductive layer 218 may function as a gate dielectric layer and may have a step-like cross-sectional structure. Next, an ion implantation process (not shown) is performed, using the patterned conductive layer 218, the patterned mask layer 220, and the dielectric layer 214 as an implantation mask, to implant dopants of the first conductivity type such as P type to penetrate the dielectric layer 216 exposed by one of the openings 222 into the epitaxial semiconductor layer 202, thereby forming a doped region 224 in the epitaxial semiconductor layer 202. Herein, the doped region 224 has the first conductivity type such as p-type and has a dopant concentration of about $1*10^{13}$-$5*10^{14}$ atom/cm$^2$. Next, a layer of dielectric layer is conformably deposited and an etching-back process (both not shown) is performed, thereby forming a spacer 226 in each of the openings 222 and on a sidewall of the gate stacks G'. Formation of the spacers 226 reduce the openings 222 into other openings 228 of a smaller size. Next, an ion implantation process (not shown) is performed, using the spacers 226, the gate stack G' and the dielectric layer 214 as an ion implantation mask, to implant dopants of the second conductive type such as N-type to penetrate the dielectric layer 216 exposed by one of the openings 222, thereby forming a doped region 230 in a portion of the doped region 224. Herein, the doped region 230 may function as a source/drain region, and the bottom surface and sidewall surfaces of the doped region 230 are surrounded by the doped region 224. The doped region 224 may have a second conductivity type such as N-type and has a dopant concentration of about $1*10^{15}$-$5*10^{15}$ atom/cm$^2$.

Figure 7:
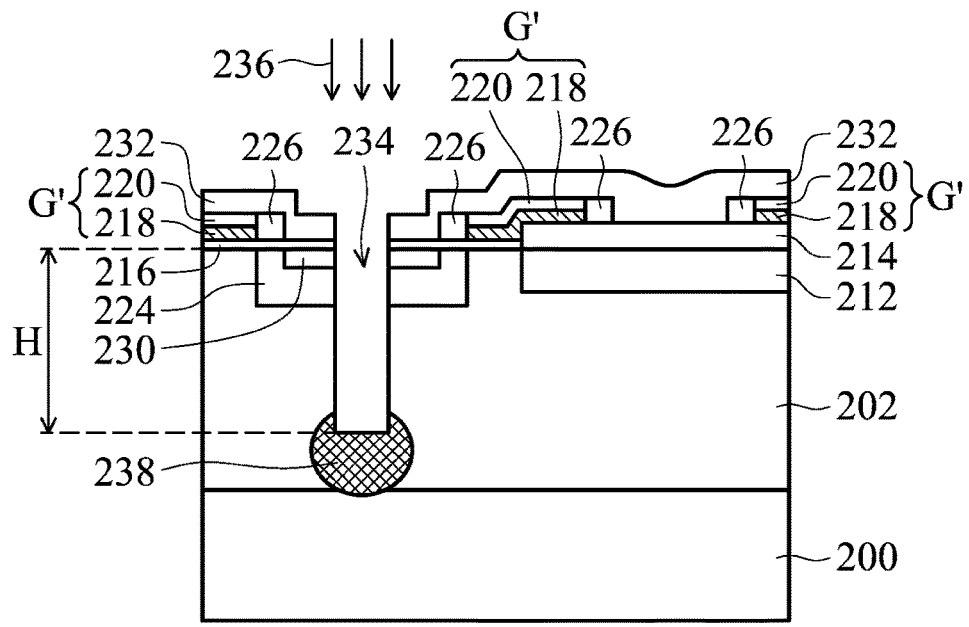

Referring to FIG. 7, an insulating layer 232 is conformably formed over the dielectric layer 200 to cover the surfaces of the gate stacks G', the spacers 226, the dielectric layer 216 and the dielectric layer 214. The insulating layer 232 may comprise insulating materials such as silicon dioxide, and can be formed by a process such as chemical vapor deposition (CVD). Next, a patterning process (not shown) comprising photolithography and etching steps is performed to form a trench 234. As shown in FIG. 7, the trench 234 has a depth H (to a top surface of the epitaxial semiconductor layer 202) and penetrates a portion of the insulating layer 232, the doped regions 224 and 230, and the epitaxial semiconductor layer 202 thereunder. Next, an ion implantation process 236 is performed, using the insulating layer 232 as an implantation mask, to implant dopants of the first conductivity type such as P-type to a portion of the epitaxial semiconductor layer 202 exposed by the trench 234, thereby forming a doped region 238 therein. After performing a thermal diffusion process (not shown), the doped region 238 physically contacts the semiconductor substrate 200 and covers the bottom surface and portions of sidewalls of the trench 234. Herein, the doped region 238 may have the first conductivity type such as P-type and has a dopant concentration of about $1*10^{15}$-$5*10^{15}$ atom/cm$^2$.

Figure 8:
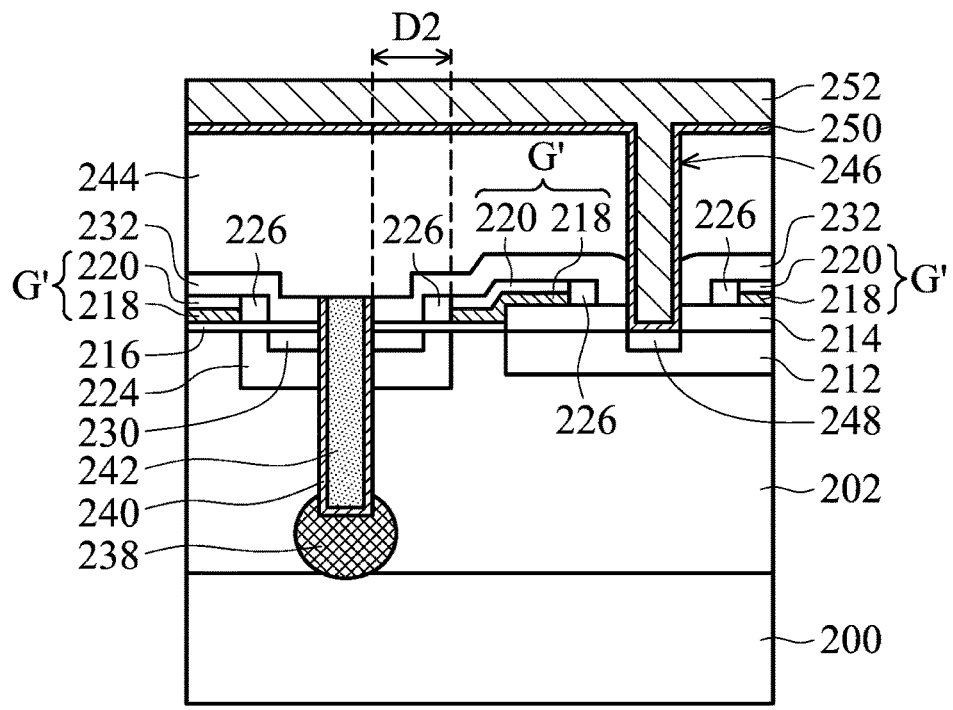

Referring to FIG. 8, a conductive layer 240 and another conductive layer 242 are then sequentially deposited over the structure shown in FIG. 7, wherein the conductive layer 240 is conformably formed over surfaces of the insulating layer 232 and the bottom surface and the sidewalls of the epitaxial semiconductor layer 202 exposed by the trench 234, and the conductive layer 242 is formed over the surfaces of the conductive layer 240, thereby filling the trench 234. In one embodiment, the conductive layer 240 may comprise conductive materials such as Ti—TiN alloy, and the conductive layer 242 may comprise conductive materials such as tungsten. Next, an etching process (not shown) is performed to remove the portion of the conductive layers 240 and 242 above the insulating layer 232, thereby leaving the conductive layers 240 and 242 in the trench 234 as a conductive contact. Next, an inter-layer dielectric (ILD) layer 244 is blanketly deposited to cover top surfaces of the insulating layer 232 and the conductive layers 240 and 242. The ILD layer 234 may comprise dielectric materials such as silicon oxide or spin-on-glass (SOG), and may be planarized to have a planar surface. Next, a patterning process (not shown) comprising photolithography and etching steps is performed to form a trench 246 in a portion of the dielectric layer 214, the insulating layer 232 and the ILD layer 244 over a portion of the doped region 212, and the trench 246 exposes a portion of the doped region 212. Next, an ion implantation process (not shown) is performed, using a suitable implantation mask, to implant dopants of the second conductivity type such as N-type, thereby forming a doped region 248 in a portion of the doped region 212. Herein, the doped region 248 may function as a source/drain region, and the bottom surface and sidewalls thereof are surrounded by the doped region 212, and the doped region 248 may have the second conductivity type such as N-type and has a dopant concentration of about $1*10^{15}$-$5*10^{15}$ atom/cm$^2$. Next, a conductive layer 250 and another conductive layer 252 are sequentially deposited, and the conductive layer 250 is conformably formed over the surfaces of the ILD layer 244 and the sidewalls exposed by the trench 246, and the conductive layer 252 is formed over the surface of the conductive layer 250, thereby filling the trench 246. The portion of the conductive layers 250 and 252 formed in the trench 246 may function as a conductive contact. In one embodiment, the conductive layer 250 may comprise conductive materials such as Ti—TiN alloy, and the conductive layer 252 may comprise conductive materials such as tungsten. Therefore, an exemplar LDMOS device is substantially fabricated, as shown in FIG. 8.

Figure 9:
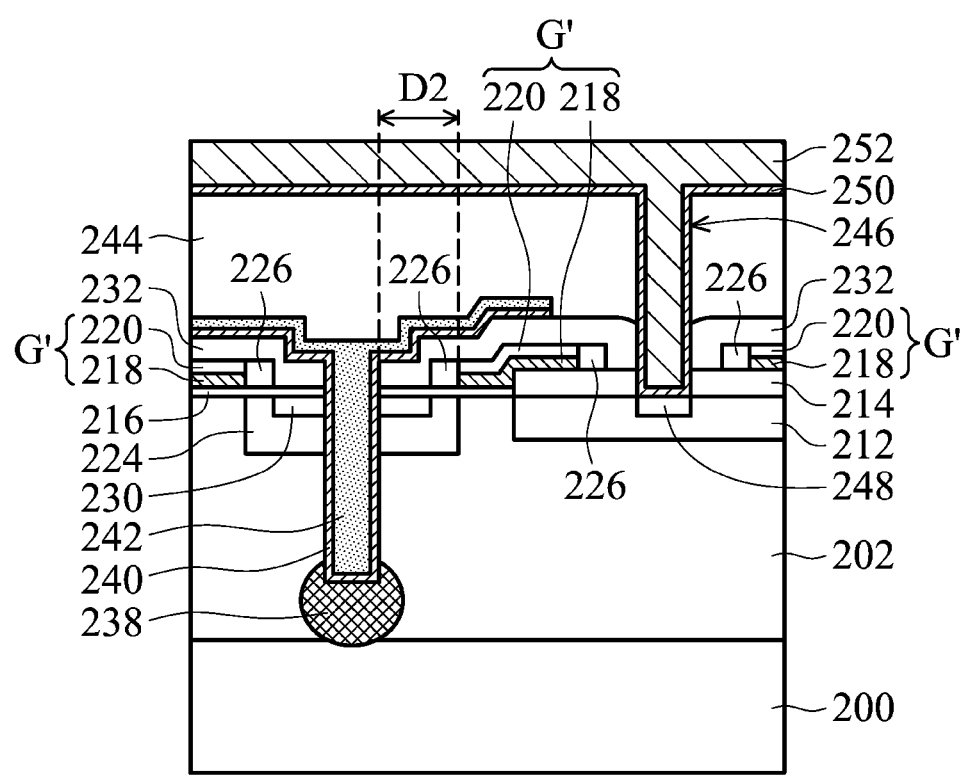
FIG. 9 is schematic cross section of a lateral double diffused metal-oxide-semiconductor (LDMOS) device according to an embodiment of the invention.

In addition, as shown in FIG. 9, another exemplar LDMOS device is illustrated. The LDMOS device in FIG. 9 is similar to the LDMOS device shown in FIG. 8, and can be formed by the processes shown in FIGS. 1-8. Herein, the etching process for removing the conductive layers 240 and 242 shown in FIG. 8 is replaced by a patterning process comprising photolithgraphy and etching steps, such that the conductive layers 240 and 242 are patterned and portions thereof now remain over the insulating layer 232.

Figure 1:
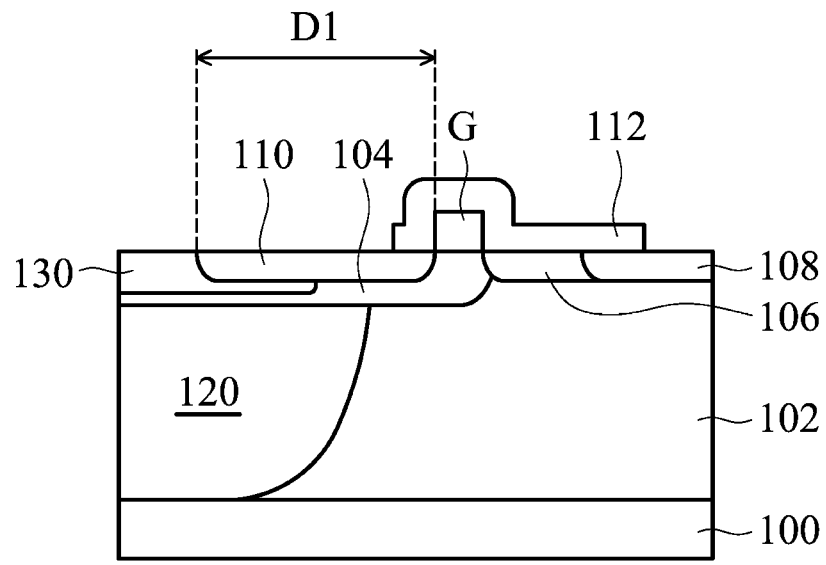
FIG. 1 is schematic cross section of a conventional lateral double diffused metal-oxide-semiconductor (LDMOS) device.

In one embodiment, one of the gate stacks G' and the doped regions 230 and 248 of the LDMOS device shown in FIGS. 8-9 may be properly electrically connected, and the regions of the first conductivity type can be P type regions, and the regions of the second conductivity type can be N type regions, such that the formed LDMOS device herein is an N type LDMOS device. At this time, the doped region 230 may function as a source region and the doped region 248 may function as a drain region. In this embodiment, during operation of the LDMOS device shown in FIGS. 8-9, currents from the drain side (e.g. the doped region 248) may flow laterally toward the source side (e.g. doped region 230) by the guidance of the doped region 224, the conductive layers 240 and 242, and the doped region 238, and then arrive at the semiconductor substrate 200, such that problems such as inductor coupling and cross-talk between adjacent circuit elements can be prevented. In this embodiment, due to the formation of the conductive layers 240 and 242 formed in the trench 234 (see FIG. 7) and the doped region 238 embedded in the epitaxial semiconductor layer 202 and contacting the semiconductor substrate 200, such that an ion implantation with high dosages and high energies for forming the P+ type doped region 120 as shown in FIG. 1 can be avoided, a predetermined distance D2 between the gate structure G and the doped region 234 at the right side of the trench 232 can be less than the predetermined distance D1 as shown in FIG. 1. Therefore, when compared with the N type LDMOS device as shown in FIG. 1, the N type LDMOS device shown in FIGS. 8-9 may have the advantages of reduced size and fabrication cost, and formation of the doped region 238, and the conductive layers 240 and 242 also helps to reduce the on-state resistance (Ron) of the N type LDMOS device. Moreover, since the portion of the dielectric layers 214 and 216 (i.e. the gate dielectric layer) covered by the gate stack G' formed between the doped regions 230 and 248 of the LDMOS device shown in FIGS. 8-9 has a step-like cross-sectional structure, such that reduction of the parasitic capacitance and increase of the breakdown voltage of the LDMOS device shown in FIGS. 8-9 can be achieved.

In addition, in another embodiment, the regions of the first conductivity type of the LDMOS device shown in FIGS. 8-9 can be N type regions, and the regions of the second conductivity type can be P type regions, such that the LDMOS device formed herein can be a P type LDMOS device.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A lateral double diffused metal-oxide-semiconductor (LDMOS) device, comprising:
    a semiconductor substrate, having a first conductivity type;
    an epitaxial semiconductor layer formed over the semiconductor substrate, having the first conductivity type;
    a gate dielectric layer formed over the epitaxial semiconductor layer, having a step-like cross-sectional structure;
    a gate stack conformably disposed over the gate dielectric layer;
    a first doped region disposed in a portion of the epitaxial semiconductor layer adjacent to a first side of the gate stack, having the first conductivity type;
    a second doped region disposed in a portion of the epitaxial semiconductor layer adjacent to a second side of the gate stack opposite to the first side, having a second conductivity type opposite to the first conductivity type;
    a third doped region disposed in a portion of the first doped region, having the second conductivity type;
    a fourth doped region disposed in a portion of the second doped region, having the second conductivity type;
    an insulating layer covering the third doped region, the gate dielectric layer, and the gate stack;
    a conductive contact formed in a portion of the insulating layer, the third doped region, the first doped region, and the epitaxial semiconductor layer; and
    a fifth doped region disposed in a portion of the epitaxial semiconductor layer under the conductive contact, having the first conductivity type, wherein the fifth doped region physically contacts the semiconductor substrate and the conductive contact.

2. The LDMOS device as claimed in claim 1, wherein the fifth doped region surrounds portions of sidewalls and a bottom surface of the conductive contact.

3. The LDMOS device as claimed in claim 1, wherein the first conductivity type is P type and the second conductivity type is N type, or the first conductivity type is N type and the second conductivity type is P type.

4. The LDMOS device as claimed in claim 1, wherein the third doped region is a source region, and the fourth doped region is a drain region.

5. The LDMOS device as claimed in claim 1, wherein the fifth doped region has a dopant concentration greater than that of the epitaxial semiconductor layer.

6. The LDMOS device as claimed in claim 1, wherein the conductive contact comprises a first conductive layer, and a second conductive layer surrounded by the first conductive layer.

7. A method for fabricating a lateral double diffused metal oxide semiconductor (LDMOS) device as set forth in claim 1, comprising:
    performing a semiconductor substrate, having a first conductivity type;
    forming an epitaxial semiconductor layer over the semiconductor substrate, having the first conductivity type;
    forming a first doped region in a portion of the epitaxial semiconductor layer, having a second conductivity type opposite to the first conductivity type;
    forming a first dielectric layer over the first doped region in the epitaxial semiconductor layer;
    forming a second dielectric layer over a portion of the epitaxial semiconductor layer, being adjacent to the first dielectric layer and in contacting therewith, wherein the first dielectric layer and the second dielectric layer have different thicknesses;
    forming a gate stack over a portion of the first dielectric layer and a portion of the second dielectric layer;
    forming a second doped region in a portion of the epitaxial semiconductor layer adjacent to a first side of the gate stack, having the first conductivity type;

forming a third doped region in a portion of the second doped region at the first side of the gate stack, having the second conductivity type opposite to the first conductivity type;

forming an insulating layer over the first dielectric layer, the gate stack, and the second dielectric layer;

forming a first trench at the first side of the gate stack, wherein the first trench penetrates a portion of the insulating layer, the second dielectric layer, the third doped region, the first doped region, and the epitaxial semiconductor layer;

performing a first ion implantation process, forming a fourth doped region in a portion of the epitaxial semiconductor layer exposed by the first trench, wherein the fourth doping region contacts the semiconductor substrate and has the first conductivity type;

forming a first conductive contact in the first trench, contacting the fourth doped region;

forming an interlayer dielectric layer over the insulating layer and the first conductive contact;

forming a second trench at the second side of the gate stack opposite to the first side, wherein the second trench penetrates a portion of the interlayer dielectric layer, the insulating layer, and the second dielectric layer and exposes a portion of the first doped region;

performing a second ion implantation process, forming a fifth doped region in a portion of the first doped region exposed by the second trench, wherein the fifth doped region has the second conductivity type; and forming a second conductive contact in the second trench, contacting the fifth doped region.

8. The method as claimed in claim 7, wherein the fourth doped region surrounds portions of sidewalls and a bottom surface of the first conductive contact.

9. The method as claimed in claim 7, wherein the first conductivity type is P type and the second conductivity type is N type, or the first conductivity type is N type and the second conductivity type is P type.

10. The method as claimed in claim 7, wherein the third doped region is a source region and the fifth doped region is a drain region.

11. The method as claimed in claim 7, wherein the fourth doped region has a dopant concentration greater than that of the epitaxial semiconductor layer.

12. The method as claimed in claim 7, wherein the first and second conductive contacts respectively comprise a first conductive layer and a second conductive layer surrounded by the first conductive layer.

13. The method as claimed in claim 12, wherein the first conductive layer comprises Ti—TiN alloy, and the second conductive layer comprises tungsten.

* * * * *